United States Patent
Cotte et al.

(10) Patent No.: US 6,221,503 B1
(45) Date of Patent: Apr. 24, 2001

(54) ELECTRODE MODIFICATION USING AN UNZIPPABLE POLYMER PASTE

(75) Inventors: John Michael Cotte, New Fairfield, CT (US); Judith Marie Roldan, Ossining, NY (US); Carlos Juan Sambucetti, Croton-on-Hudson, NY (US); Ravi F. Saraf, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/382,400

(22) Filed: Aug. 24, 1999

Related U.S. Application Data

(62) Division of application No. 08/965,227, filed on Nov. 6, 1997, now Pat. No. 6,013,713.

(51) Int. Cl.[7] ............... B32B 15/02; B05D 3/02
(52) U.S. Cl. ............ 428/553; 156/51; 427/123; 427/154; 427/226; 428/559; 428/620; 428/626; 428/643; 428/645; 428/646; 428/672; 428/457
(58) Field of Search ............... 428/553, 559, 428/620, 626, 643, 645, 646, 672, 457; 156/51; 427/226, 123, 154

(56) References Cited

U.S. PATENT DOCUMENTS

| | | | |
|---|---|---|---|
| 4,539,222 | * 9/1985 | Anderson, Jr. et al. | 427/226 |
| 5,091,346 | 2/1992 | Inoue et al. | 501/93 |
| 5,287,620 | 2/1994 | Suzuki et al. | 29/852 |
| 5,314,709 | 5/1994 | Doany et al. | 427/96 |
| 5,561,622 | 10/1996 | Bertin et al. | 365/51 |
| 5,683,529 | 11/1997 | Makihara et al. | 156/89 |

* cited by examiner

Primary Examiner—Deborah Jones
Assistant Examiner—Robert R. Koehler
(74) Attorney, Agent, or Firm—Robert M. Trepp

(57) ABSTRACT

A paste is described for capping electrodes with an oxide free metal layer incorporating a solvent, an unzippable polymer and particles. The electrode could be an interconnect such as a C4 bump. A method for forming a coating and for testing integrated circuit chips is also described. The invention overcomes the problem of interconnecting Pb containing electrodes that are covered with an insulating oxide on integrated circuit chips by coating the Pb containing electrode with Au to provide an oxide free surface for testing and interconnection.

6 Claims, 6 Drawing Sheets

ELECTRODE MODIFICATION USING AN UNZIPPABLE POLYMER PASTE

This is a division of application Ser. No. 08/965,227, filed Nov. 6, 1997, now U.S. Pat. No. 6,013,713.

FIELD OF THE INVENTION

This invention relates to a paste and more particularly to a paste including an unzippable polymer, solvent and conductive particles for coating electrodes such as C4 bumps with oxide free conductive particles for applications such as low temperature interconnections between an integrated circuit chip and a substrate made of polymer/filler composites, such as an FR4 printed circuit board.

BACKGROUND OF THE INVENTION

With more and more transistors being placed on a chip to increase the number of functions, the number of input/output (I/O) pads per integrated circuit chip has increased significantly. The increase in the number of I/O pads per chip are making traditional bonding methods, such as wire bonding (WB) and tape automated bonding (TAB) difficult. Flip chip attach (FCA), which is usually an area array in contrast to a peripheral array for WB and TAB, is becoming increasingly pervasive due to the number of pads. In FCA, the chip is bumped with a lead-rich Pb/Sn alloy ball using metal deposition through a resist-mask, for example. The bonding of this chip is achieved by self alignment and placing the chip on the substrate which has been covered with high viscosity flux to reduce oxides. The chip is held in place by the flux. The whole assembly (chip and substrate) is subsequently heated in the range from 350 to 400° C. to a temperature which melts the solder forming an interconnect between balls or bumps on a chip and respective pads on a substrate.

Conventionally the substrates were multi-layer ceramic (MLC) structures that could withstand temperatures up to 400° C. Dictated by both the number of pads and lower cost, there is a growing need to attach similar C4 bumped integrated circuit chips to organic substrates made of polymer/filler composites, such as FR4. Such organic substrates degrade at solder reflow temperatures above 300° C. Thus a low temperature joining material is needed to attach the C4 bumps of a chip to respective substrate pads.

One method to attach electrodes such as C4 bumped chips to an organic substrate is by capping the C4 bumps first with a low temperature melting Pb/Sn-eutectic solder such as described in U.S. Ser. No. 08/710,992 filed Sep. 25, 1996 by Berger et al. entitled "Method for Making Interconnect for Low Temperature Chip Attachment" (YO996073) and assigned to the assignee herein. The Pb/Sn solder cap over the C4 bump may be accomplished by vapor depositing the metal components through a resist mask, followed by solder reflow step. The masking process requires expensive alignment and lithographic steps, and the vapor deposition process is costly due to high vacuum processing. The bonding is accomplished by reflowing the Pb/Sn-eutectic solder at temperatures below 250° C. using acidic flux. Subsequently, the flux is removed using organic solvents that may be chloro-fluoro-carbon (CFC) based.

SUMMARY OF THE INVENTION

In accordance with the present invention, a paste is described comprising a solvent for an unzippable polymer, an unzippable polymer dissolved in the solvent to form a solution, and particles suspended in the solution. The particles may be suitable for coating the surface of a selected material; and the polymer may comprise 10 wt. % or greater of the solution.

The invention further provides a coating comprising a substrate and a layer of the paste mentioned above that leaves a layer of particles which may be heated to form an alloy with the substrate material.

The invention further provides a method for testing the integrated circuit chip with C4 bumps that are coated using the disclosed method. The particles in the paste being conductive and adherent to the C4 surface will provide a conductive path between the C4 bumps and conductive pads on the test probe.

The invention further provides a method for coating C4 electrodes or bumps on an integrated circuit chip comprising the steps of applying a paste mentioned above to the surface of the C4 electrodes, the particles in the paste being conductive and adherent to the surface of the substrate, and heating the paste to remove the solvent and the unzippable polymer wherein the particles may alloy with the Pb in the C4.

The invention provides a low cost C4 capping method.

The invention provides a method that does not require any lithography, alignment or vacuum processing steps.

The invention provides a bonding process that uses conductive adhesive on the substrate that does not require any flux, hence no cleaning step. The conductive adhesive may typically be a silver or gold filled epoxy.

The invention provides a bonding process using a conductive organic composite that allows for greater thermal mismatch between the chip and the substrate than a solid metal solder joint would.

The invention provides a bonding process that allows flip chip to pads on organic substrates where the mismatch in the thermal coefficient of expansion (TCE) is significantly larger than the TCE between an integrated circuit chip and a ceramic substrate.

The invention provides a testing process that would allow the C4 bumps to be tested by conventional methods of pressure contact before bonding.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1A:
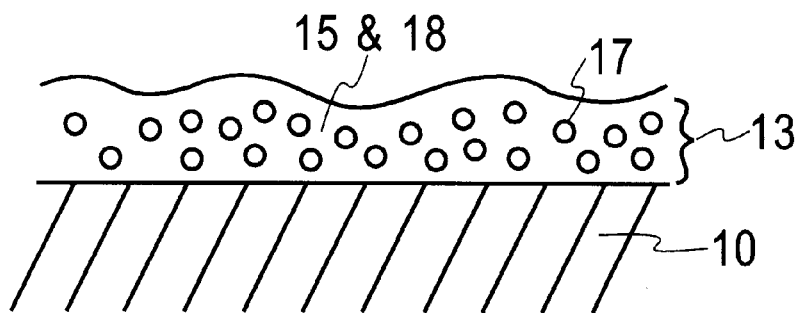
FIG. 1A shows one embodiment of the invention.
Figure 1B:
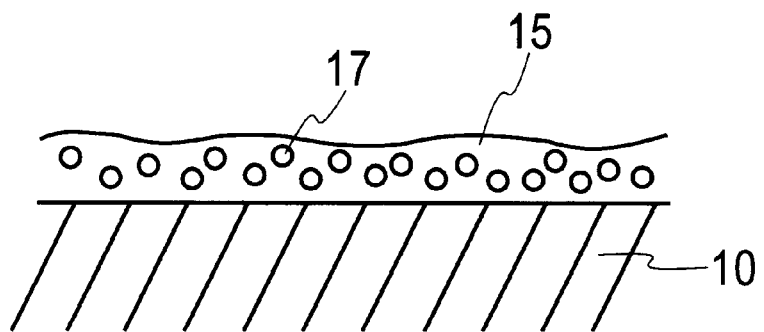
FIG. 1B shows an intermediate step in using the embodiment of FIG. 1A.

Referring to FIG. 1A, a substrate 10 and a coating of unzippable paste 13 is shown. Unzippable paste 13 comprises an unzippable polymer 15 and/or their blends dissolved in solvent 18, particles 17 such as oxide-free metal. An oxide-free metal or surface is one that does not form an oxide layer to permit a conductivity greater than 1 ohm-cm or the oxide layer is conducting with a conductivity greater than 1 ohm-cm. For example, C4 bumps of an alloy of 97 wt. % Pb and 3 wt. % Sn typically have an oxide coating or layer which provides a contact resistance which is greater than 1 ohm-cm without reflow of the solder in the C4 bump. Unzippable polymer 15 is a polymer that completely volatilizes above a certain temperature defined as the unzipping temperature, $T_{unzip}$. Some examples of unzippable polymers 15 include poly(methyl methacrylate) (PMMA), poly($\alpha$-methyl styrene) (PAMS), poly(propylene carbonate), poly (ethylene carbonate), and poly(chloral). All these polymers have a $T_{unzip}$ below 400° C.

Solvent 18 is one that may be organic and dissolves the above mentioned polymers. For example, N-methyl pyrrolidinone (NMP) is a good solvent for PMMA and PAMS.

Particles 17 may be composed of one or more metals. At least one of the metal components should form an alloy with Pb or Sn wherein the alloy melts in the temperature range from 150 to 400° C. For example, particle 17 may be Au, Sn, or Au/Sn alloy. The particle should be oxide free or with an oxide that is conductive. The particles could also be made of composite material where the inner core may be ceramic or metal and the outer layer is an oxide free metal or a conductive oxide. Particles in the paste may be in the range from 1 to 50 volumetric %.

Solvent 18 in paste 13 is removed by drying at $T_{dry}$ under a selected environment, leaving polymer 15 and particles 17 on the surface of substrate 10. The temperature is then raised above the unzipping temperature $T_{unzip}$ of unzippable polymer 15 which results in the degradation and evaporation of the polymer components.

Figure 1C:
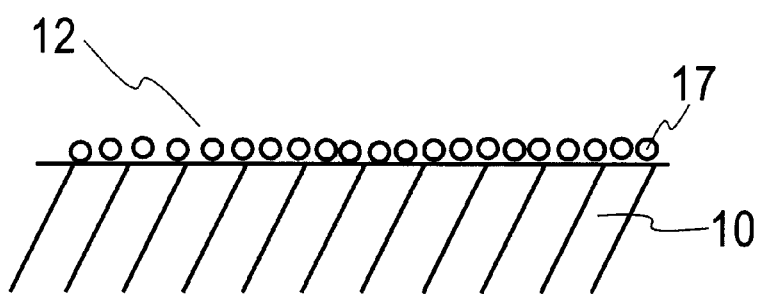
FIG. 1C shows the final result of using the embodiment of FIG. 1A.

FIG. 1C shows the final structure of substrate 10 coated with particles 17 after unzipping. The $T_{dry}$ is more than 50° C. below the $T_{unzip}$. The selected environment may be air, $N_2$, vacuum, forming gas, Ar, He or a combination thereof. Coating 12 may be patterned or uniform over substrate 10. Selective coating 12 may be achieved by a standard dispensing process such as screening, stenciling, etc. Particles 17 shown in FIG. 1C may be in a monolayer or multilayer. Particles 17 may form an interconnected percolating structure or discrete islands.

Figure 2:
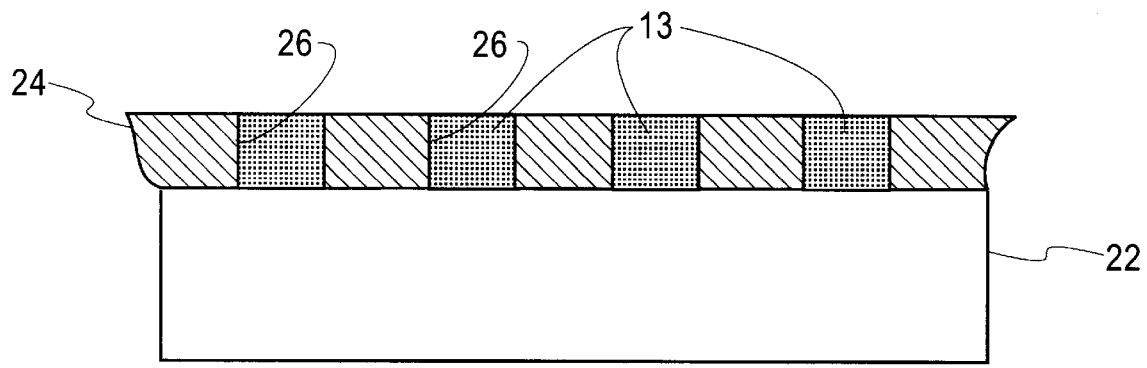
FIGS. 2–4 show a sequence of steps for placing a coating of unzippable paste on C4 bumps of an integrated circuit.
Figure 3:
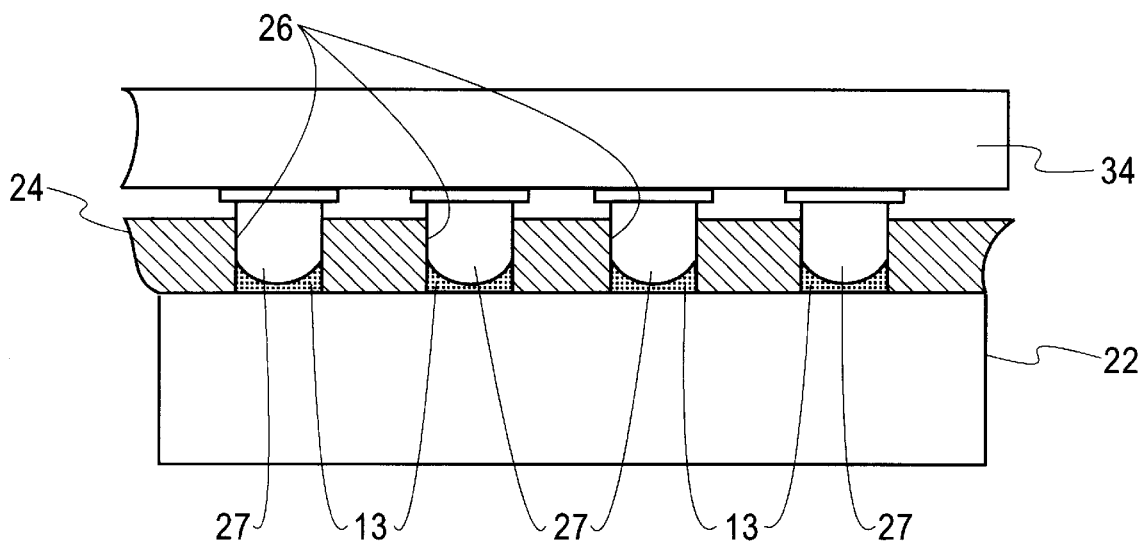
Figure 4:
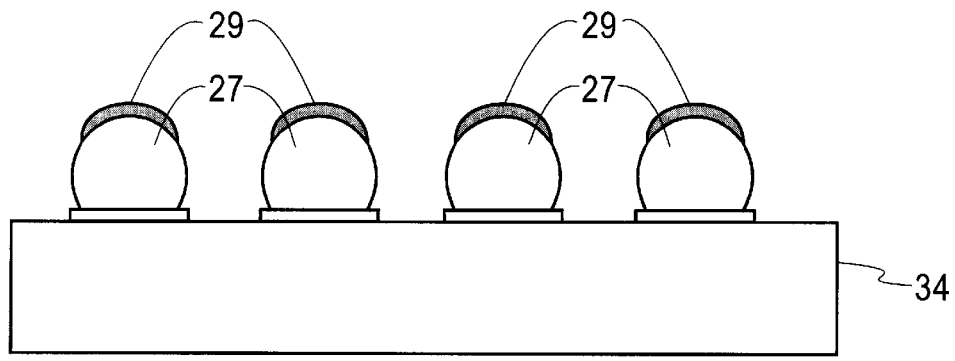

FIGS. 2–4 show steps for coating C4 bumps of an integrated circuit with unzippable paste 13. Unzippable paste 13 is screened on a smooth, clean surface of a solid substrate 22 through an interposer 24. Substrate 22 may be glass, silicon or ceramic. Interposer 24 may comprise polyimide, polyester or other organic material or metal such as molybdenum, nickel, stainless steel, etc. Interposer 24 may have a plurality of openings or vias 26 which are slightly larger than the diameter of the C4 bumps 27 to be coated. The thickness of interposer 24 is less than the height of the C4 bump 27. Typically, the diameter of C4 bump 27 is 75 $\mu$m. The diameter of opening 26 may be in the range from 85 to 100 $\mu$m and the thickness of interposer 24 may be 50 $\mu$m. FIG. 2 shows openings 26 filled with unzippable paste 13. Interposer 24 can be made by chemical etch, laser ablation or other conventional means to match the pattern of C4 bumps on a chip or wafer.

Some other method of transferring the unzippable paste 13 to C4 bumps 27 may be by pin transfer, dipping, brushing, etc.

Substrate 22 is then placed over or under a chip or wafer 34 of undiced or embedded chips having a plurality of C4 bumps 27 thereon. Openings 26 filled with unzippable paste 13 are aligned with corresponding bumps 27 on wafer 34.

The alignment is done by self aligning the chip with the vias 26 in interposer 24. Substrate 22 is brought closer to chip or wafer 34 so that C4 bumps 27 are pressed into openings 26 and in contact with unzippable paste 13 as shown in FIG. 3. Substrate 22 is then separated from or moved away from chip or wafer 34 so that C4 bumps 27 are separated from contact with unzippable paste 13 in openings 26. A thin layer 29 of unzippable paste 13 adheres to C4 bumps 27 as the chip or wafer 34 is removed from proximity of substrate 22 as shown in FIG. 4. In this example, the geometry of each C4 is well defined dimensionally and by composition,the contact area to unzippable paste 13 is nominally identical for each bump. As a result, the thickness and size of the paste film forming thin layer 29 on the C4 bumps 27 are nominally of the same thickness. The thickness of thin layer 29 may be in the range from 0.1 to 50 $\mu$m with a thickness variation in the range from 0.05 to 25 $\mu$m. The process can be repeated a number of times by heating to $T_{dry}$ to increase the amount of particles adhering to the C4 bumps.

Thin layer 29 is first dried by heating to $T_{dry}$, then heated above $T_{unzip}$ and the melting temperature of the solder metals in the C4 bumps 27. The particles embed into the molten C4 or react with solder metal, to form a strong bond between the particle and the C4. The particles adhere to the C4 bump by a mechanism of alloying, softening, interdiffusion and/or interlocking.

Depending upon the particular unzippable polymer, metal, alloy, or other material selected. $T_{unzip}$ may be above or below the melting temperature $T_{melt}$ of the metal, alloy or other material. Where $T_{unzip}$ is above $T_{melt}$ heating may be above $T_{unzip}$ in one step. Where $T_{unzip}$ is below $T_{melt}$, heating may first be above $T_{unzip}$ and below $T_{melt}$ and then raised above $T_{melt}$.

Best practice is to completely remove the unzippable polymer prior to raising the temperature to $T_{melt}$ or above.

Heating is done typically in an oven or zone furnace with a nitrogen or preferably forming gas environment. During this thermal cycle, the unzippable paste 13 unzips and vaporizes and the metal filler particles 17 fuse with respective C4 bumps forming an oxide-free conductive coating 32 on C4 bumps 27.

Figure 5:
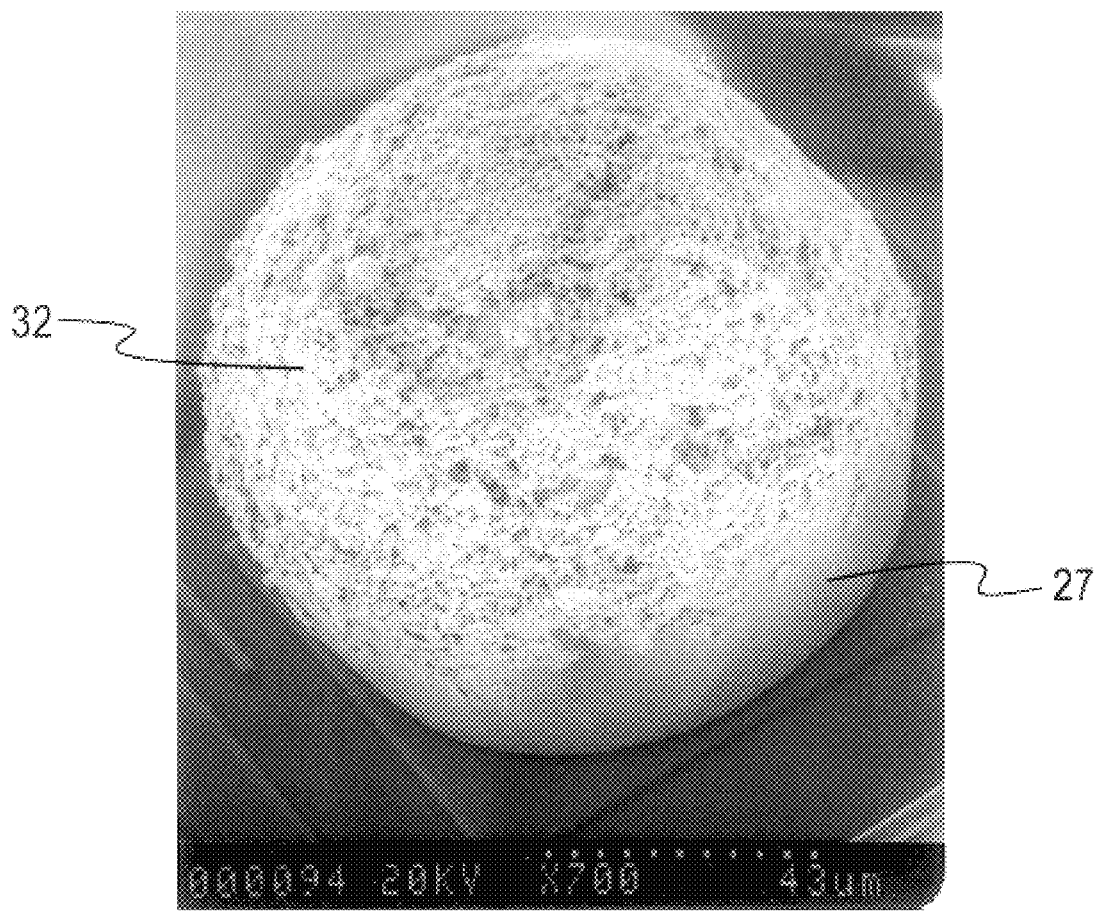
FIG. 5 is a SEM image of a C4 bump after a heating cycle having a metal coating as in FIG. 1C.

FIG. 5 shows an image of conductive coating 32 on a C4 bump 27 taken by Scanning Electron Microscopy (SEM). The image in FIG. 5 was taken after the heating cycle was completed at 360° C. for 30 mins. in a forming gas environment. Conductive coating 32 as shown in FIG. 5 is a uniform layer or coating of particles 17 which are Au.

Figure 6:
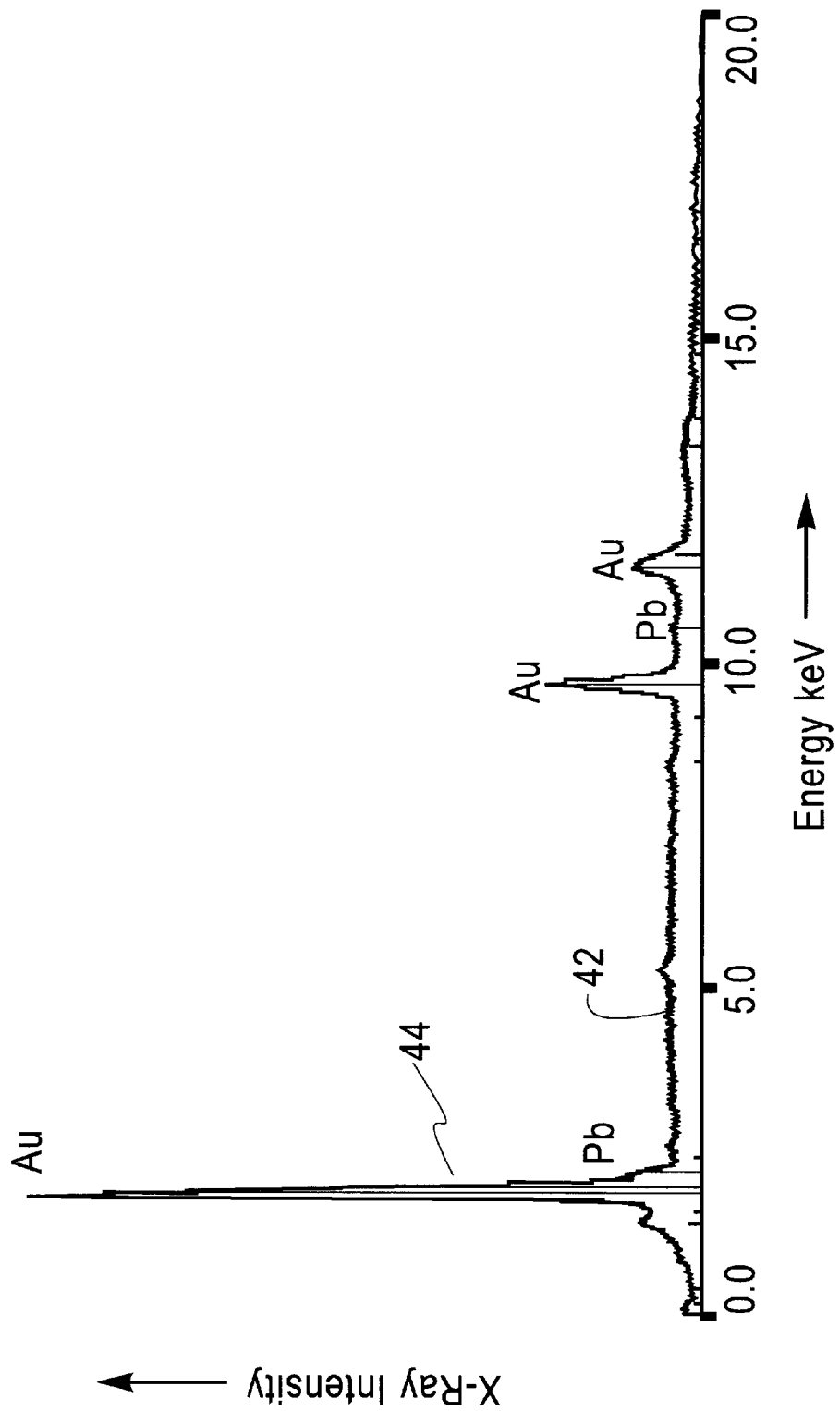
FIG. 6 is a graph of data from Energy Dispersive X-ray Analysis of a gold coated site on the C4 bump after the coating process.

FIG. 6 is a graph of Energy Dispersive X-ray Analysis of a site on conductive coating 32 on the C4 bump 27 shown in FIG. 5. In FIG. 6 the ordinate represents X-ray intensity and the abscissa represents energy in keV. Curve 42 shows the X-ray intensity as a function of energy from 0 to 20 keV. Peak 44 shows that the top surface of conductive coating 32 is Au with very small traces of Pb. Curve 44 illustrates that conductive coating 32 has a high coverage of gold over C4 bump 27.

Figure 7:
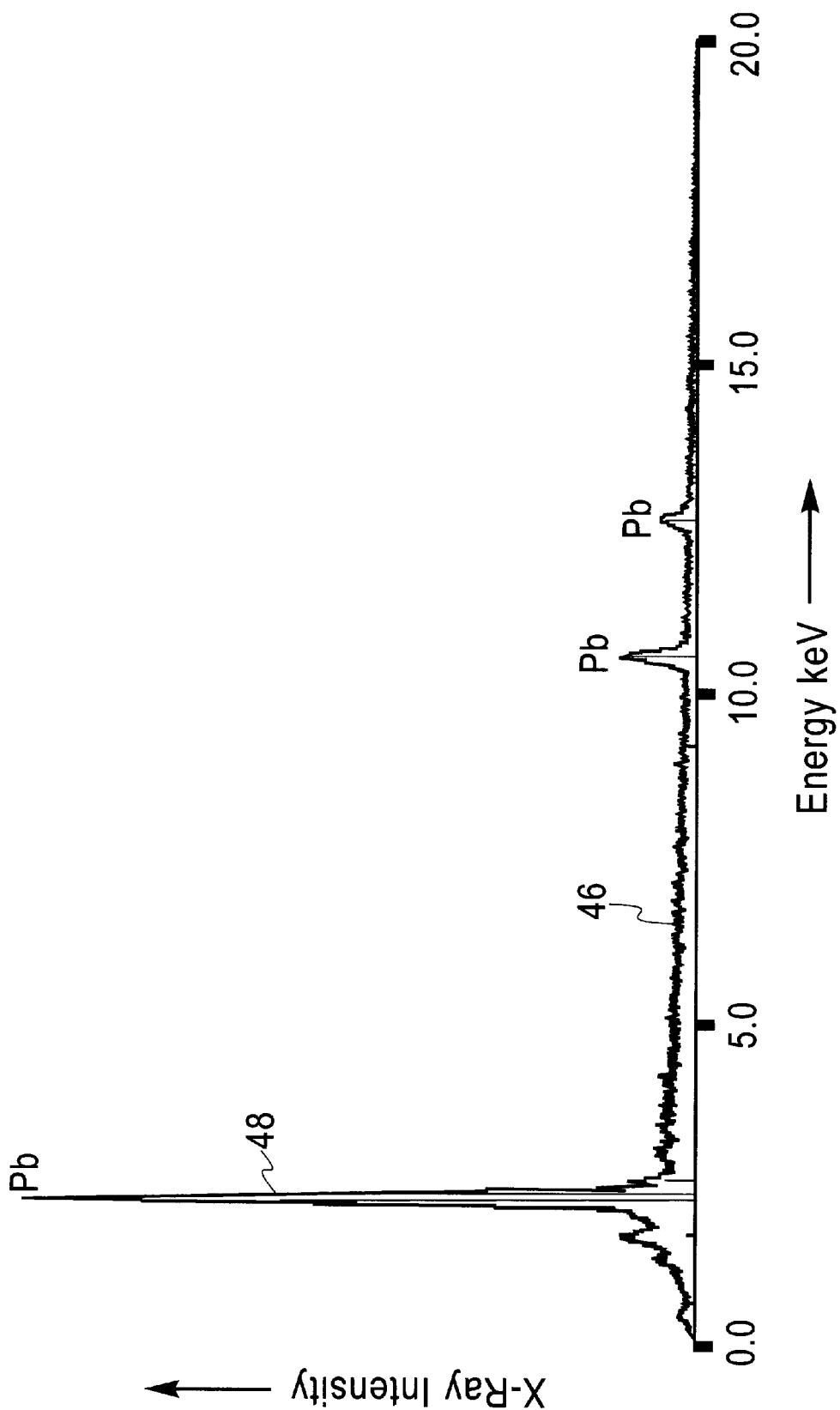
FIG. 7 is a graph of data from Energy dispersive X-ray Analysis of an uncoated site of lead on the C4 bump in FIG. 6.

FIG. 7 is a graph of Energy Dispersive X-ray Analysis of a site on C4 bump 27 without conductive coating 32. FIG. 7 is formed from data obtained from the C4 bump 27 shown in FIG. 5. In FIG. 7, the ordinate represents X-ray intensity and the abscissa represents energy in keV. Curve 46 shows the X-ray intensity as a function of energy from 0 to 20 keV. Peak 48 shows that the surface of C4 bump 27 is Pb.

Figure 8:
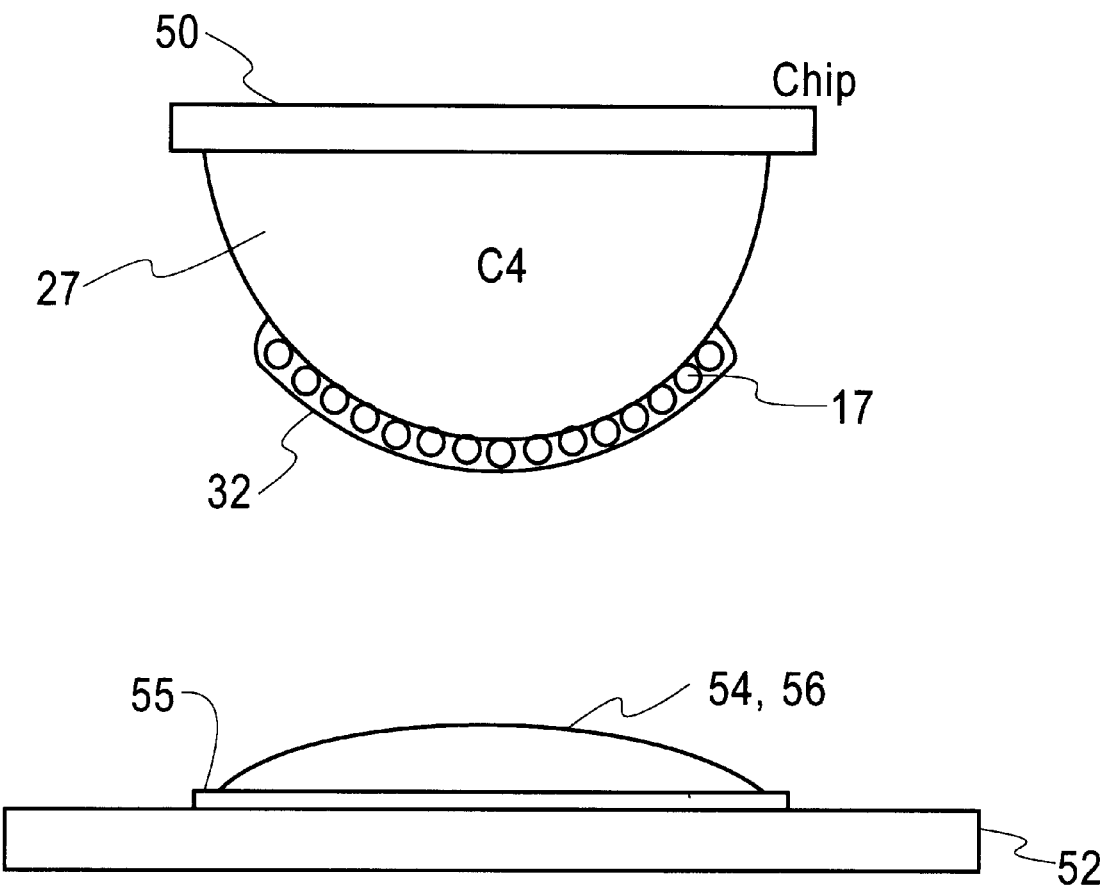
FIG. 8 shows the final structure of a C4 bump coated with oxide free particles to be bonded to a paste bumped substrate.

A process for bonding chips 50 to a substrate 52 is now described. The chips 50 to be bonded would be processed to form, as described above, a layer 32 of particles 17 on its C4 bumps 27. A conductive adhesive paste 54 comprising a polymer binder and noble metal particles would be placed on electrical pads 55 on substrate 52. The polymer binder may be a thermoplastic or thermoset polymer. The paste may also contain a solvent system that dissolves the polymer binder. Chip 50, after C4 bumps 27 are processed to contain a Au layer 32, is bonded to paste 54 or paste bump 56 on substrate 52 by a method shown in FIG. 8. An example of a conductive paste suitable for use herein is described in U.S. Pat. No. 5,086,558 by Grube et al. which issued Feb. 11, 1992 and in U.S. Ser. No. 08/734,492 by R. Booth et al. filed Oct. 21, 1996, both of which are incorporated herein by reference. Typically if paste 54 is epoxy based, chip 50 is bonded by heating the assembly in a temperature range from 150 to 250° C. with 0 to 100 psi pressure. If paste 54 is thermoplastic, the temperature range is the same but the pressure can range from 10 to 100 psi. The attached chip 50 is then underfilled by an encapsulant to form a typical finished assembly.

A process of testing the chip is now described. The C4 bumps of the chip to be tested would be coated with layer 32 by a process described above. The C4 bumps are electrically connected to the pads of the test probe by either physical contact using force or bonding using the thermoplastic paste method described above. For both methods, the contact pads of the test probe are oxide free.

C4 bumped chips are needed to be attached to FR4 or other organic substates. Such assemblies will be used in computers, office equipment, automobiles and trucks, control systems, cellular phones, etc.

While there has been described and illustrated a process for forming a metal coating on a structure such as capping C4 bumps with Au to provide an oxide free surface on C4 bumps on an integrated circuit chip, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A coating on a C4 bump comprising:
   a C4 bump,
   a layer of paste on said C4 bump,
   said paste including:
   a solvent for an unzippable polymer,
   an unzippable polymer dissolved in said solvent to form a solution, and
   particles suspended in said solution,
   said particles suitable for coating the surface of said C4 bump,
   said unzippable polymer comprising 10 wt % or greater of said solution.

2. The coating of claim 1 wherein said C4 bump has a surface containing lead,
   said unzippable polymer vaporizes completely above a first temperature, and
   wherein said particles adhere to said surface of said C4 bump upon contact.

3. The coating of claim 2 wherein said solvent and unzippable polymer are removed by raising the temperature of said solvent above a second temperature and said unzippable polymer above said first temperature.

4. The coating of claim 2 wherein said particles adhere to said C4 bump by a mechanism selected from the group consisting of alloying, softening, interdiffusion, and interlocking.

5. The coating of claim 1 wherein said particles include a metal selected from the group consisting of Au, Sn and Au/Sn alloy.

6. A method for coating electrodes on a semiconductor chip with metal particles comprising the steps of:
   applying a paste to the surface of said electrodes,
   said paste comprising:
   a solvent for an unzippable polymer,
   an unzippable polymer dissolved in said solvent to form a solution, and
   particles suspended in said solution,
   said particles suitable for coating said the surface of said electrodes,
   said unzippable polymer comprising 10 wt % or greater of said solution,
   said particles in said paste being conductive and adherent to the surface of said electrodes, and
   heating said paste to remove said solvent and said unzippable polymer.

* * * * *